(12) United States Patent
Inoue et al.

(10) Patent No.: US 8,822,834 B2
(45) Date of Patent: Sep. 2, 2014

(54) PRINTED CIRCUIT BOARD AND METHOD OF MANUFACTURING THE SAME

(75) Inventors: Shinichi Inoue, Ibaraki (JP); Hiroyuki Hanazono, Ibaraki (JP); Mineyoshi Hasegawa, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 461 days.

(21) Appl. No.: 13/187,830

(22) Filed: Jul. 21, 2011

(65) Prior Publication Data

US 2012/0024574 A1 Feb. 2, 2012

(30) Foreign Application Priority Data

Jul. 30, 2010 (JP) ................................. 2010-172616

(51) Int. Cl.
*H05K 1/00* (2006.01)

(52) U.S. Cl.
USPC ......................................... 174/258

(58) Field of Classification Search
USPC .......................... 174/250, 255, 258
See application file for complete search history.

(56) References Cited

U.S. PATENT DOCUMENTS

| | | | |
|---|---|---|---|
| 5,672,409 A | 9/1997 | Miyakawa et al. | |
| 2008/0264672 A1* | 10/2008 | Markley et al. | 174/250 |
| 2009/0008142 A1 | 1/2009 | Shimizu et al. | |
| 2010/0164362 A1* | 7/2010 | Miyakawa et al. | 313/498 |

FOREIGN PATENT DOCUMENTS

| | | |
|---|---|---|
| JP | H05-243697 A | 9/1993 |
| JP | H07-161216 A | 6/1995 |
| JP | H07-241952 A | 9/1995 |
| JP | H08-16175 B2 | 2/1996 |
| JP | 2000-348784 | 12/2000 |
| JP | 2005-101047 A | 4/2005 |
| JP | 2005-158379 | 6/2005 |
| JP | 2007-059386 A | 3/2007 |
| JP | 2007-218980 A | 8/2007 |
| JP | 2008-169237 A | 7/2008 |
| WO | 2007097249 A1 | 8/2007 |

* cited by examiner

*Primary Examiner* — Jeremy C Norris
(74) *Attorney, Agent, or Firm* — Panitch Schwarze Belisario & Nadel LLP

(57) ABSTRACT

A printed circuit board includes a base insulating layer formed of a porous film. Conductor traces are formed on the base insulating layer formed of the porous film. A cover insulating layer is formed on the base insulating layer to cover the conductor traces. The porous film used as the base insulating layer has a reflectivity of not less than 50% for light of at least a part of wavelengths in a wavelength region from 400 nm to 800 nm.

8 Claims, 4 Drawing Sheets

PRINTED CIRCUIT BOARD AND METHOD OF MANUFACTURING THE SAME

BACKGROUND OF THE INVENTION

1. Field of the Invention

The present invention relates to a printed circuit board and a method of manufacturing the same.

2. Description of the Background Art

Flexible printed circuit boards are used in various types of electronic equipment. For example, conductor traces are formed on a base insulating layer, and a cover insulating layer is formed on the base insulating layer to cover the conductor traces in a general flexible printed circuit board. Various elements or electronic circuits are mounted on the flexible printed circuit board. Examples of the elements include photoelectric conversion elements (solar cell), light emitting diodes and so on. Light incident from the outside must be efficiently converted into electricity in order to improve conversion efficiency of the photoelectric conversion element. Light generated in the inside must be efficiently taken out to the outside in order to improve light emitting efficiency of the light emitting diode.

Providing a reflecting layer or a scattering layer in the photoelectric conversion element (see JP 2000-348784 A) and providing a light scattering/reflecting layer in the photoelectric conversion element (see JP 2005-158379 A), for example, have been proposed in order to improve the conversion efficiency of the photoelectric conversion element.

Moreover, providing a reflector to which inorganic fillers are added has been proposed in order to improve light emission efficiency of the light emitting diode (see JP 2007-218980 A).

However, providing the reflecting layer, the scattering layer or the light scattering/reflecting layer in the photoelectric conversion element increases the number of manufacturing steps. This leads to an increase in manufacturing cost of the photoelectric conversion element. Also, providing the reflector in the light emitting diode increases the manufacturing cost. Therefore, it is desired to improve the efficiency of the element without increasing the manufacturing cost of the element. Alternatively, the improved efficiency of the element attributed to its configuration is desired to be further improved.

BRIEF SUMMARY OF THE INVENTION

An object of the present invention is to provide a printed circuit board and a method of manufacturing the same capable of improving efficiency of an element that receives or emits light.

(1) According to one aspect of the present invention, a printed circuit board includes an insulating layer formed of a porous film, and a conductor trace formed on the insulating layer, wherein the porous film has a reflectivity of not less than 50% for light of at least a part of wavelengths in a wavelength region of not less than 400 nm and not more than 800 nm.

In the printed circuit board, the porous film of the insulating layer has the reflectivity of not less than 50% for the at least part of the wavelengths in the wavelength region of not less than 400 nm and not more than 800 nm. Therefore, when an element that receives light is mounted on the printed circuit board, light directly incident on the element is taken in the element, and light reflected on the insulating layer is taken in the element. This improves light collecting efficiency of the element. When an element that emits light is mounted on the printed circuit board, light is taken out from an upper surface of the element, and light emitting from a lower surface of the element is reflected on the insulating layer and passes through the element to be taken out from the upper surface of the element. This improves light emitting efficiency of the element. In this manner, the efficiency of the element that receives or emits light can be improved.

(2) The porous film may have an average pore size of not less than 0.001 μm and not more than 10 μm. In this case, the porous film having the reflectivity of not less than 50% for the light of the at least part of the wavelengths in the wavelength region of not less than 400 nm and not more than 800 nm can be easily obtained.

(3) The printed circuit board may further include an element that receives or emits light, wherein the element may be mounted on the insulating layer to be electrically connected to the conductor trace. In this case, the efficiency of the element mounted on the insulating layer is improved.

(4) The porous film may have a reflectivity of not less than 50% for a wavelength of light of at least any of red, green and blue. In this case, the efficiency of an element that receives or emits light of red, green or blue is improved.

(5) The porous film may have reflectivities of not less than 50% for wavelengths of light of red, green and blue. In this case, even when an element that receives or emits light of any of red, green and blue is mounted on the insulating layer, the efficiency of the element is improved.

(6) The porous film may have reflectivities of not less than 80% for wavelengths of light of red, green and blue. In this case, even when an element that receives or emits light of any of red, green and blue is mounted on the insulating layer, the efficiency of the element is sufficiently improved.

(7) According to another aspect of the present invention, a method of manufacturing a printed circuit board includes the steps of preparing an insulating layer formed of a porous film having a reflectivity of not less than 50% for light of at least a part of wavelengths in a wavelength region of not less than 400 nm and not more than 800 nm, and forming a conductor trace on the insulating layer.

In the printed circuit board manufactured by the manufacturing method, the porous film of the insulating layer has the reflectivity of not less than 50% for the at least part of the wavelengths in the wavelength region of not less than 400 nm and not more than 800 nm. Therefore, when an element that receives light is mounted on the printed circuit board, light directly incident on the element is taken in the element, and light reflected on the insulating layer is taken in the element. This improves light collecting efficiency of the element. When an element that emits light is mounted on the printed circuit board, light is taken out from an upper surface of the element, and light emitting from a lower surface of the element is reflected on the insulating layer and passes through the element to be taken out from the upper surface of the element. This improves light emitting efficiency of the element. In this manner, the efficiency of the element that receives or emits light can be improved.

(8) The method of manufacturing the printed circuit board may further include the step of mounting an element that receives or emits light on the insulating layer such that the element is electrically connected to the conductor trace. In this case, the efficiency of the element mounted on the insulating layer is improved.

According to the present invention, the efficiency of the element that receives or emits light can be improved.

Other features, elements, characteristics, and advantages of the present invention will become more apparent from the following description of preferred embodiments of the present invention with reference to the attached drawings.

DETAILED DESCRIPTION OF THE INVENTION

Description will be made of a flexible printed circuit board according to one embodiment of the present invention with reference to the drawings. In the following description, the flexible printed circuit board is abbreviated as the printed circuit board.

(1) Configuration of the Printed Circuit Board

Figure 1:
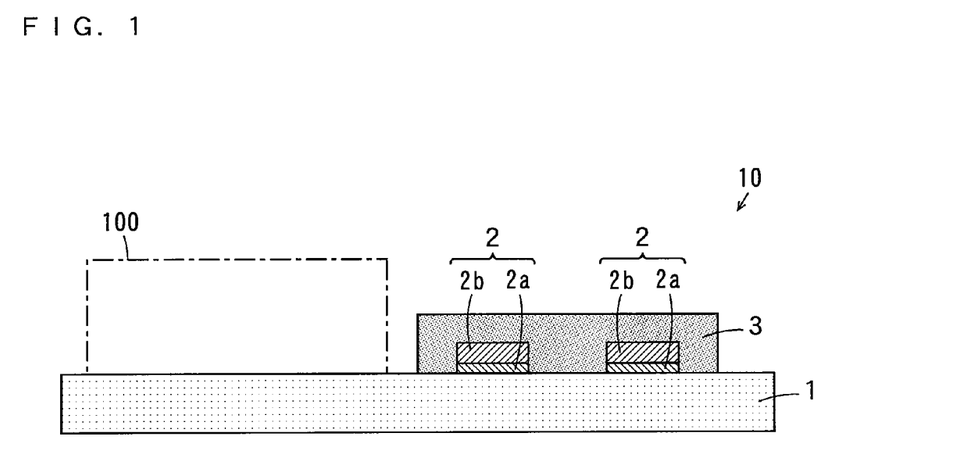
FIG. 1 is a schematic sectional view of a printed circuit board according to one embodiment of the present invention.

FIG. 1 is a schematic sectional view of the printed circuit board according to the one embodiment of the present invention. The printed circuit board 10 shown in FIG. 1 includes a base insulating layer 1 made of a porous film. A plurality of conductor traces 2 are formed on the base insulating layer 1 made of the porous film. Each conductor trace 2 is a wiring trace or a ground trace. Each conductor trace 2 has a laminated structure of a seed layer 2a made of chromium, for example, and a conductor layer 2b made of copper, for example. A cover insulating layer 3 is formed on the base insulating layer 1 to cover the plurality of conductor traces 2.

An element 100 that receives or emits light is mounted on the printed circuit board 10 having such a configuration. The element 100 is a photoelectric conversion element (solar cell, for example) that converts light into electricity, a light receiving element such as a photodiode, or a light emitting element such as a light emitting diode, for example. Terminals of the element 100 are electrically connected to any ones of the conductor traces 2.

The cover insulating layer 3 may be formed on the base insulating layer 1 to cover the entire conductor traces 2, or may be formed on the base insulating layer 1 to cover part of the conductor traces 2. A porous film may be used as the cover insulating layer 3.

The thickness of the base insulating layer 1 is not less than 1 μm and not more than 500 μm, preferably not less than 10 μm and not more than 200 μm, and more preferably not less than 10 μm and not more than 100 μm, for example. The base insulating layer 1 having the thickness of not more than 500 μm improves its flexibility. The base insulating layer 1 having the thickness of not less than 1 μm improves its insulation characteristics.

The thickness of the seed layer 2a is preferably not less than 0.05 μm and not more than 1 μm. The thickness of the conductor trace 2 is not less than 1 μm and not more than 100 μm, and preferably not less than 10 μm and not more than 50 μm, for example.

The thickness of the cover insulating layer 3 is not less than 1 μm and not more than 500 μm, preferably not less than 10 μm and not more than 200 μm, and more preferably not less than 10 μm and not more than 100 μm, for example. The cover insulating layer 3 having the thickness of not more than 500 μm improves its flexibility. The cover insulating layer 3 having the thickness of not less than 1 μm improves its insulation characteristics.

The material for the porous film may be any of polyimide, cycloolefin polymer, polytetrafluoroethylene, polyetherimide, polyolefin, polyethylene naphthalate, polyethylene terephthalate, polycarbonate, polyarylate, polyphenylene sulfide, polyether sulfane, polyether ether ketone, polyamide or the like, or may be mixture of two or more types of the foregoing materials.

The porous film is formed to have a reflectivity of not less than 50% for light of at least a part of the wavelengths in a wavelength region from 400 nm to 800 nm. The porous film having a reflectivity of not less than 50% for a wavelength of light treated by the mounted element 100 is used for the base insulating layer 1.

A dry method and a wet method can be used as a method for forming the porous film. The dry method includes a physical method and a chemical method. In the physical method, a low-boiling liquid such as chlorofluorocarbons or carbon hydrides is dispersed in polymer as a foaming agent, and the foaming agent is then heated to be volatilized, thereby forming cells, for example. In the chemical method, a compound that is the foaming agent is added to a polymer base, and a gas generated by pyrolyzing the foaming agent forms cells, for example.

In another method, a gas such as nitrogen or carbon dioxide is dissolved in polymer at high pressure. The pressure is then released, and the gas is heated up to around a glass transition temperature or a softening point of the polymer, thereby forming cells.

The wet method includes an extraction method, for example. A particular microphase-separated structure is formed by adding additives to the polymer, and the foregoing additives are removed by heating and solvent extraction utilizing differences of volatility (boiling point) or heat decomposition and solubility in a solvent of the both components, thereby forming cells.

The average pore size of the porous film is not less than 0.001 μm and not more than 50 μm, preferably not less than 0.03 μm and not more than 10 μm, and more preferably not less than 0.03 μm and not more than 5 μm, for example. The porous film whose average pore size is not more than 50 μm ensures strength of the base insulating layer 1.

The porosity of the porous film is not less than 10% and not more than 95%, and preferably not less than 30% and not more than 95%, for example. The porous film whose porosity is not more than 95% ensures durability of the base insulating layer 1. The porous film whose porosity is not less than 10% provides sufficiently high light reflectivity.

The porous film used as the base insulating layer 1 has the reflectivity of not less than 50% for the light of the at least part of the wavelengths in the wavelength region from 400 nm to 800 nm in the printed circuit board 10 according to the present embodiment. Therefore, when the photoelectric conversion element or the light receiving element is mounted on the printed circuit board 10 as the element 100, light directly incident on the element 100 is taken in the element 100, and the light reflected on the base insulating layer 1 is taken in the element 100. This improves collecting efficiency of the light of the element 100. When the light emitting element is mounted on the printed circuit board 10 as the element 100, light is taken out from an upper surface of the element 100, and light emitting from a lower surface of the element 100 is reflected on the insulating layer 1 and passes through the element 100 to be taken out from the upper surface of the element 100. This improves light emission efficiency of the element 100. In this manner, the efficiency of the element 100 is improved.

The porous film may have a reflectivity of not less than 50% for a wavelength of light of at least one of red, green and blue. Here, the red light includes at least a wavelength of 700 nm. The green light includes at least a wavelength of 546 nm. The blue light includes at least a wavelength of 435 nm. In this case, the efficiency of the element 100 that receives the light of red, green or blue or the element 100 that emits the light of red, green or blue is improved.

The porous film preferably has reflectivities of not less than 50% for the wavelengths of the light of red, green and blue. In this case, even when the element 100 that receives the light of any of red, green and blue or the element 100 that emits the light of any of red, green and blue is mounted on the printed circuit board 10, the efficiency of the element 100 is improved.

The porous film more preferably has reflectivities of not less than 80% for the wavelengths of the light of red, green and blue. In this case, even when the element 100 that receives the light of any of red, green and blue or the element 100 that emits the light of any of red, green and blue is mounted on the printed circuit board 10, the efficiency of the element 100 is sufficiently improved.

(2) Method of Manufacturing the Printed Circuit Board 10

Figure 2:
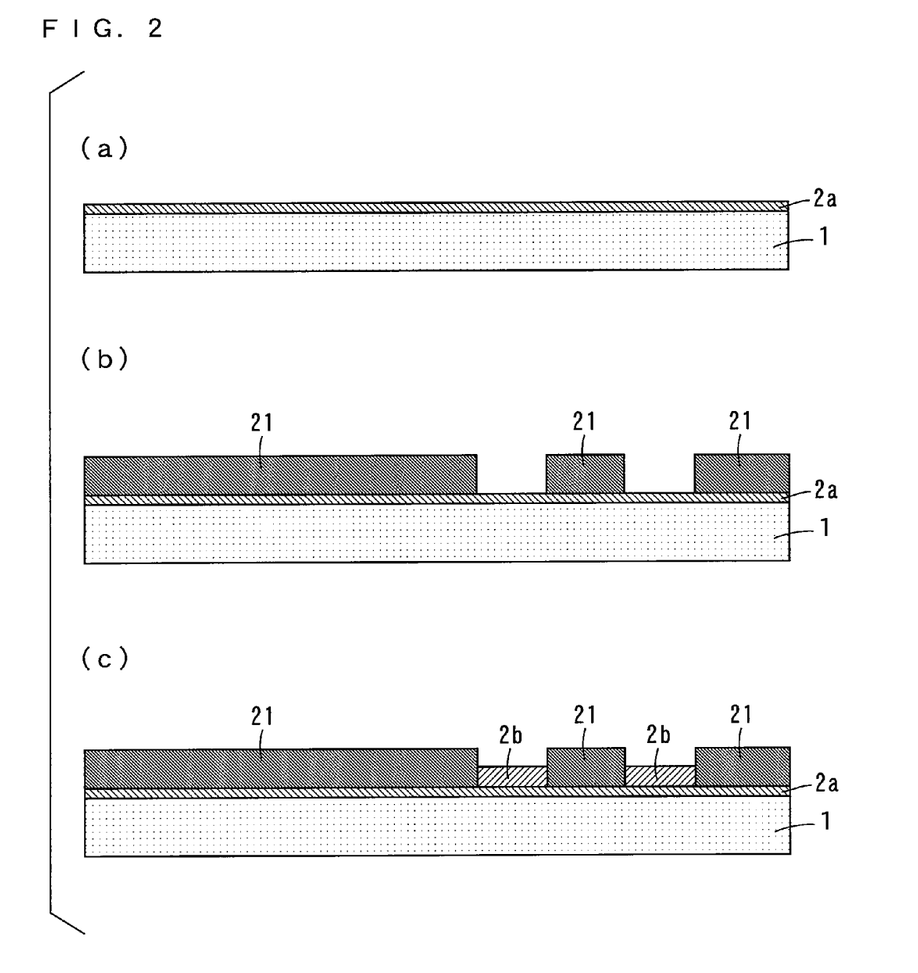
FIGS. 2(a) to (c) are sectional views for illustrating steps in a method of manufacturing the printed circuit board.
Figure 3:
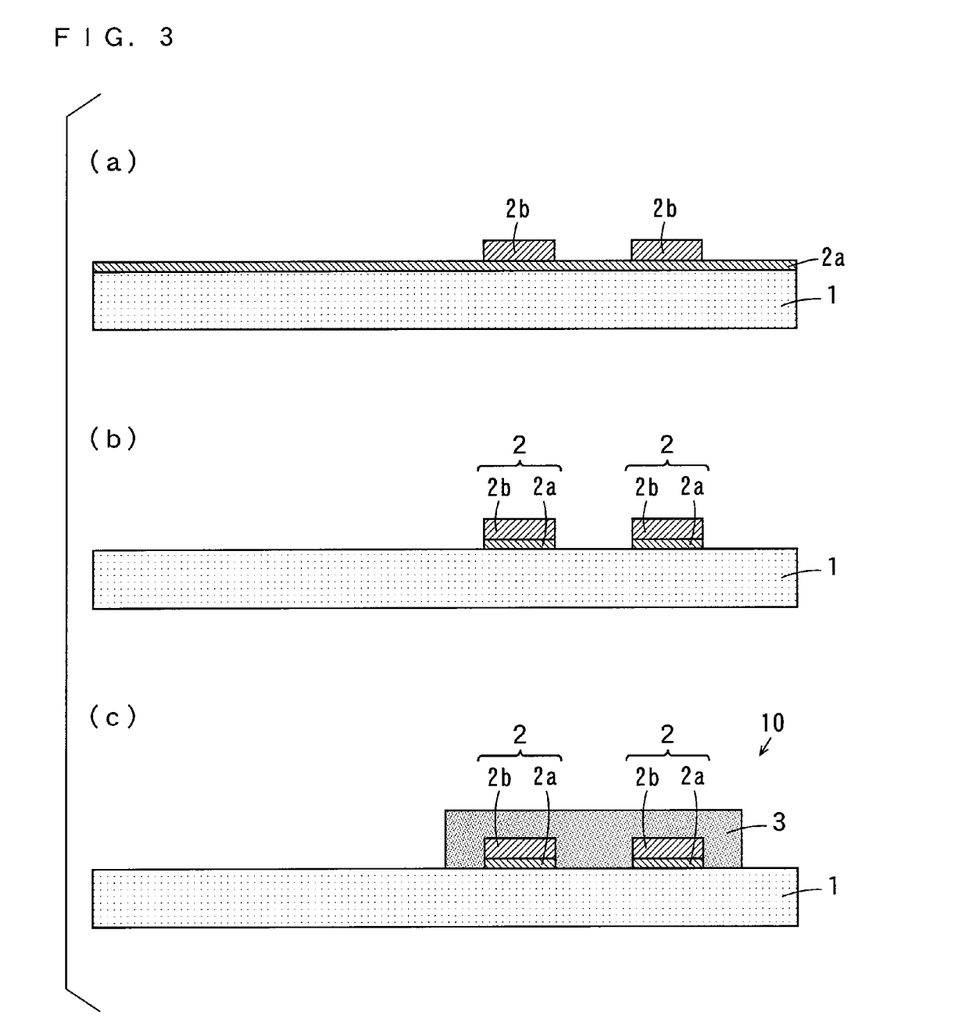
FIGS. 3(a) to (c) are sectional views for illustrating steps in the method of manufacturing the printed circuit board.

FIGS. 2 and 3 are sectional views for illustrating steps in a method of manufacturing the printed circuit board 10. The example of FIG. 2 shows the method of manufacturing the printed circuit board 10 by a semi-additive method.

First, the seed layer 2a made of chromium is formed on the base insulating layer 1 formed of the foregoing porous film by a sputtering method, for example, as shown in FIG. 2(a). The seed layer 2a may be formed by electroless plating.

Next, a resist film is formed of a dry film resist, for example, on the seed layer 2a, and the resist film is exposed using a mask having a given pattern, followed by development. In this manner, a plating resist 21 is formed on the seed layer 2a as shown in FIG. 2(b).

Then, the conductor layer 2b made of copper, for example, is formed by electrolytic plating on the seed layer 2a excluding a region of the plating resist 21 as shown in FIG. 2(c).

The plating resist 21 is subsequently removed by chemical etching (wet etching) or stripping as shown in FIG. 3(a). An exposed region of the seed layer 2a is then removed by etching. Accordingly, the plurality of conductor traces 2 (see FIG. 1) composed of the seed layer 2a and the conductor layer 2b are formed as shown in FIG. 3(b). Each conductor trace 2 is a wiring trace or a ground trace, for example.

The cover insulating layer 3 made of polyimide, for example, is formed on the base insulating layer 1 to cover the plurality of conductor traces 2 as shown in FIG. 3(c). In this manner, the printed circuit board 10 shown in FIG. 1 is completed.

While the conductor traces 2 are formed by the semi-additive method in the method of manufacturing the printed circuit board 10 shown in FIGS. 2 and 3, the conductor traces 2 may be formed by a subtractive method.

(3) Inventive Examples

First, a plurality of porous films and a plurality of non-porous films were manufactured or prepared in the following manner.

(3-1) Preparation for the Porous Films and the Non-porous Films (a) Porous Polyimide (PI) Film A porous polyimide (PI) film was formed in the following manner. 27 grams of p-phenylenediamine (PDA) was put into a separable flask of 500 ml provided with an agitating machine and a thermometer, and 392 grams of N-methyl-2-pyrrolidone (NMP) was added and agitated, so that the PDA was dissolved.

Next, 73.5 grams of 3,3',4,4'-biphenyltetracarboxylic dianhydride (BPDA) was gradually added in the vessel and then continuously agitated for two hours at a temperature of 30° C. or less, so that a polyimide resin precursor solution having a concentration of 20% by weight was obtained. The intrinsic viscosity of the polyimide resin precursor solution (measured at a concentration of 0.5 g/100 ml in NMP and at 30° C.) was 1.5, and the solution viscosity at 30° C. was 800 Pa·s.

38 parts by weight, with respect to 100 parts by weight of the polyimide resin precursor 100, of urethane acrylate oligomer whose weight-average molecular weight was 1100 was added to the obtained polyimide resin precursor solution and agitated, so that a transparent and uniform solution was obtained. The solution was applied on a stainless steel foil (SUS304) having a thickness of 25 μm using a spin coater, and a solvent was dried in an oven with internal air circulation for 15 minutes at 90° C. and 10 minutes at 180° C. Thus, the polyimide resin precursor film having the microphase-separated structure of urethane acrylate oligomer and having a thickness of 15 μm was obtained.

After that, the obtained polyimide resin precursor film was heated at 350° C. under vacuum of 0.01 torr, so that the polyimide porous film from which urethane acrylate oligomer was removed was formed. The polyimide porous film was cut in the shape of a sheet having a diameter of 80 mm, put in a pressure-resistant vessel of 500 cc, and pressurized at 25 MPa in an atmosphere of 40° C. After that, an operation of extracting polyurethane acrylate oligomer was performed for two hours by injecting and discharging $CO_2$ in a gas amount at a flow rate of about 3 liter/minute while the pressure was maintained. Accordingly, the porous polyimide (PI) film was obtained.

(b) Porous Polyetherimide (PEI) Film

A porous polyetherimide (PEI) film was formed in the following manner. 27 grams of PEI (ULTEM by SABIC Innovative Plastics Japan LLC) was put into a separable flask of 500 ml provided with an agitating machine and a thermometer, and 392 grams of N-methyl-2-pyrrolidone (NMP) was added and agitated, so that the PEI was dissolved.

38 parts by weight, with respect to 100 parts by weight of resin, of urethane acrylate oligomer whose weight-average molecular weight was 1100 was added to the obtained solution and agitated, so that a transparent and uniform solution was obtained. The solution was applied on a stainless steel foil (SUS304) having a thickness of 25 μm using a spin coater, and a solvent was dried in an oven with internal air circulation for 15 minutes at 90° C. and 10 minutes at 180° C. Thus, the film having the microphase-separated structure of urethane acrylate oligomer and having a thickness of 15 μm was obtained.

After that, the obtained film was heated at 350° C. under vacuum of 0.01 torr, so that the porous film from which urethane acrylate oligomer was removed was formed. The porous film was cut in the shape of a sheet having a diameter of 80 mm, put in a pressure-resistant vessel of 500 cc, and pressurized at 25 MPa in an atmosphere of 40° C. After that, an operation of extracting polyurethane acrylate oligomer was performed for two hours by injecting and discharging $CO_2$ in a gas amount at a flow rate of about 3 liter/minute while the pressure was maintained. Accordingly, the porous polyetherimide (PEI) film was obtained.

(c) Porous Cycloolefin Polymer (COP) Film

A porous cycloolefin polymer (COP) film was formed in the following manner. 27 grams of COP (ARTON by JSR Corporation) was put into a separable flask of 500 ml provided with an agitating machine and a thermometer, and 392 grams of N-methyl-2-pyrrolidone (NMP) was added and agitated, so that the COP was dissolved.

38 parts by weight, with respect to 100 parts by weight of resin, of urethane acrylate oligomer whose weight-average molecular weight was 1100 was added to the obtained solution and agitated, so that a transparent and uniform solution was obtained. The solution was applied on a stainless steel foil (SUS304) having a thickness of 25 µm using a spin coater, and a solvent was dried in an oven with internal air circulation for 15 minutes at 90° C. and 10 minutes at 180° C. Thus, the film having the microphase-separated structure of urethane acrylate oligomer and having a thickness of 15 µm was obtained.

After that, the obtained film was heated at 350° C. under vacuum of 0.01 torr, so that the porous film from which urethane acrylate oligomer was removed was formed. The porous film was cut in the shape of a sheet having a diameter of 80 mm, put in a pressure-resistant vessel of 500 cc, and pressurized at 25 MPa in an atmosphere of 40° C. After that, an operation of extracting polyurethane acrylate oligomer was performed for two hours by injecting and discharging $CO_2$ in a gas amount at a flow rate of about 3 liter/minute while the pressure was maintained. Accordingly, the porous cycloolefin polymer (COP) film was obtained.

(d) Porous Polytetrafluoroethylene (PTFE) Film

NTF-1122 by Nitto Denko Corporation was prepared as a porous polytetrafluoroethylene (PTFE) film.

(e) Polyimide (PI) Film

A polyimide (PI) film was formed in the following manner. 27 grams of p-phenylenediamine (PDA) was put into a separable flask of 500 ml provided with an agitating machine and a thermometer, and 392 grams of N-methyl-2-pyrrolidone (NMP) was added and agitated, so that the PDA was dissolved.

Next, 73.5 grams of 3,3',4,4'-biphenyltetracarboxylic dianhydride (BPDA) was gradually added in the vessel and continuously agitated for two hours at a temperature of 30° C. or less, so that a polyimide resin precursor solution having a concentration of 20% by weight was obtained. The intrinsic viscosity of the polyimide resin precursor solution (measured at a concentration of 0.5 g/100 ml in NMP and at 30° C.) was 1.5, and the solution viscosity at 30° C. was 800 Pa·s.

The solution was applied on a stainless steel foil (SUS304) having a thickness of 25 µm using a spin coater, and a solvent was dried in an oven with internal air circulation for 15 minutes at 90° C. and 10 minutes at 180° C. Thus, the polyimide (PI) film having a thickness of 15 µm was obtained.

(f) Polyethylene Terephthalate (PET) Film

Tetoron (trademark) by Teijin DuPont Films Japan Limited was prepared as a polyethylene terephthalate (PET) film.

(g) Liquid Crystal Polymer (LCP) Film

VECSTAR by Kuraray Co., Ltd. was prepared as a liquid crystal polymer (LCP) film.

(3-2) Measurement of Pore Size

The pore sizes and porosity of the foregoing porous films were measured in the following manner. The porous films were freeze-fractured in liquid nitrogen, the cross sections were observed at an accelerating voltage of 10 kV using a scanning electron microscope (SEM) (Hitachi S-570), and the pore sizes (diameters of the cells) were obtained by image processing.

The average pore size of the porous polyimide (PI) film was 1 µm. The average pore size of the porous polyetherimide (PEI) film was 5 µm. The average pore size of the porous cycloolefin polymer (COP) film was 3 µm. The average pore size of the porous polytetrafluoroethylene (PTFE) film was 0.1 µm.

(3-3) Measurement of the Porosity

The porosity was obtained from the apparent density $\rho_1$ (g/cm$^3$) of the porous film and the density $\rho_0$ (g/cm$^3$) of resin constituting the porous film measured according to JISK6885 using the following equation:

$$\text{Porosity (\%)} = 100 \times (\rho_0 - \rho_1)/\rho_0$$

The porosity of the porous polyimide (PI) film was 50%. The porosity of the porous polyetherimide (PEI) film was 75%. The porosity of the porous cycloolefin polymer (COP) film was 60%. The porosity of the porous polytetrafluoroethylene (PTFE) film was 71%.

(3-4) Formation of Samples

Samples were formed for inventive examples 1 to 4, comparative examples 1, 2 and a reference example 1 using the foregoing porous films and non-porous films as the base insulating layers 1.

Figure 4:
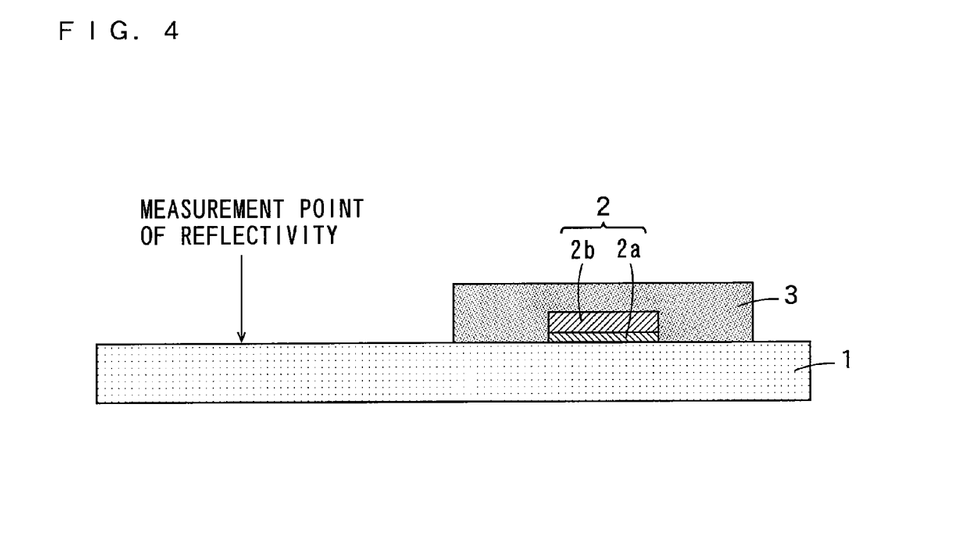
FIG. 4 is a schematic sectional view showing the configuration of a sample of each of inventive examples 1 to 4, comparative examples 1, 2 and a reference example 1.

FIG. 4 is a schematic sectional view showing the configuration of the sample of each of the inventive examples 1 to 4, the comparative examples 1,2 and the reference example 1. As shown in FIG. 4, the conductor trace 2 composed of the seed layer 2a and the conductor layer 2b was formed on the base insulating layer 1, and the cover insulating layer 3 was formed on the base insulating layer 1 to cover the conductor traces 2.

(a) The Inventive Example 1

In the inventive example 1, the sample shown in FIG. 4 was formed by the semi-additive method described with reference to FIGS. 2 and 3 using the foregoing porous polyimide (PI) film as the base insulating layer 1.

First, the base insulating layer 1 made of the porous polyimide film was subjected to nitriding by plasma processing, and the seed layer 2a made of chromium and having a thickness of 100 nm was formed on the base insulating layer 1 by a sputtering method. Next, the dry film resist was laminated on the seed layer 2a and exposed using a mask having a given pattern, followed by development, thereby forming the plating resist. The conductor layer 2b made of copper and having a thickness of 18 µm was subsequently formed by electrolytic plating on the seed layer 2a excluding a region of the plating resist. After the plating resist was removed, an exposed region of the seed layer 2a was removed by etching. Thus, the conductor trace 2 composed of the seed layer 2a and the conductor layer 2b was formed as shown in FIG. 4. The cover insulating layer 3 made of polyimide was formed on the base insulating layer 1 to cover the conductor trace 2.

(b) The Inventive Example 2

In the inventive example 2, the sample shown in FIG. 4 was formed in the same manner as the inventive example 1 except that the foregoing porous polyetherimide (PEI) film was used as the base insulating layer 1.

(c) The Inventive Example 3

In the inventive example 3, the sample shown in FIG. 4 was formed in the same manner as the inventive example 1 except that the foregoing porous cycloolefin polymer (COP) film was used as the base insulating layer 1.

(d) The Inventive Example 4

In the inventive example 4, the sample shown in FIG. 4 was formed in the same manner as the inventive example 1 except that the foregoing porous polytetrafluoroethylene (PTFE) film was used as the base insulating layer 1.

(e) The Comparative Example 1

In the comparative example 1, the sample shown in FIG. 4 was formed in the same manner as the inventive example 1 except that the foregoing polyimide (PI) film was used as the base insulating layer 1.

(f) The Comparative Example 2

In the comparative example 2, the sample shown in FIG. 4 was formed in the same manner as the inventive example 1 except that the foregoing polyethylene terephthalate (PET) film was used as the base insulating layer 1.

(g) The Reference Example 1

In the reference example 1, the sample shown in FIG. 4 was formed in the same manner as the inventive example 1 except that the foregoing liquid crystal polymer (LCP) film was used as the base insulating layer 1.

(3-5) Measurement of Reflectivity

In each of the samples of the inventive examples 1 to 4, the comparative examples 1, 2 and the reference example 1, light reflectivity of the base insulating layer 1 of FIG. 4 was measured by a spectrophotometer (V-670 by JASCO Corporation).

(3-6) Evaluation

Measurement results of the pore size, porosity and light reflectivity of the porous film of each of the samples of the inventive examples 1 to 4, the comparative examples 1, 2, and the reference example 1 are shown in Table 1.

TABLE 1

| SAMPLE | BASE INSULATING LAYER | REFLECTIVITY[%] RED 700 [nm] | GREEN 546 [nm] | BLUE 435 [nm] | PORE SIZE [μm] | POROSITY [%] |
|---|---|---|---|---|---|---|
| INVENTIVE EXAMPLE 1 | POROUS PI | 67 | 39 | 15 | 1 | 50 |
| INVENTIVE EXAMPLE 2 | POROUS PEI | 90 | 90 | 83 | 5 | 75 |
| INVENTIVE EXAMPLE 3 | POROUS COP | 80 | 81 | 82 | 3 | 60 |
| INVENTIVE EXAMPLE 4 | POROUS PTFE | 82 | 87 | 91 | 0.1 | 71 |
| COMPARATIVE EXAMPLE 1 | PI | 11 | 23 | 30 | — | — |
| COMPARATIVE EXAMPLE 2 | PET | 11 | 11 | 13 | — | — |
| REFERENCE EXAMPLE 1 | LCP | 59 | 61 | 59 | — | — |

As shown in Table 1, the reflectivity for red light was 67%, which was sufficiently higher than 50%, in the sample of the inventive example 1 using the porous polyimide (PI) film as the base insulating layer 1.

Reflectivities for light of red, green and blue were 90%, 90% and 83%, respectively, which were higher than 80%, in the sample of the inventive example 2 using the porous polyetherimide (PEI) film as the base insulating layer 1.

Reflectivities for light of red, green and blue were 80%, 81% and 82%, respectively, which were higher than 80%, in the sample of the inventive example 3 using the porous cycloolefin polymer (COP) film as the base insulating layer 1.

Reflectivities for light of red, green and blue were 82%, 87% and 91%, respectively, which were higher than 80%, in the sample of the inventive example 4 using the porous polytetrafluoroethylene (PTFE) film as the base insulating layer 1.

In contrast, reflectivities for light of red, green and blue were 11%, 23% and 30%, respectively, which were lower than 50%, in the sample of the comparative example 1 using the polyimide (PI) film as the base insulating layer 1.

Reflectivities for light of red, green and blue were 11%, 11% and 13%, respectively, which were lower than 50%, in the sample of the comparative example 2 using the polyethylene terephthalate (PET) film as the base insulating layer 1. Reflectivities for light of red, green and blue were 59%, 61% and 59%, respectively, which were higher than 50% in the sample of the reference example 1 using the liquid crystal polymer (LCP) film as the base insulating layer 1.

The results show that the reflectivity of the light of the at least part of the wavelengths in a visible light region (400 nm to 800 nm) can be 50% or more by using the porous film as the base insulating layer 1.

The dielectric constant of the base insulating layer 1 can be lower when the porous film is used as the base insulating layer 1 than when the liquid crystal polymer (LCP) film is used as the base insulating layer 1. This improves high frequency characteristics of the printed circuit board 10.

(4) Other Embodiments

The material for the seed layer 2a is not limited to chromium. For example, the material may have a two-layer structure of chromium and copper.

The seed layer 2a may not be formed when the conductor layer 2b is formed by another method instead of electrolytic plating.

The material for the conductor layer 2b is not limited to copper. For example, another metal material such as a copper alloy, gold and aluminum may be used.

(5) Correspondences between Elements in the Claims and Parts in Embodiments

In the following paragraph, non-limiting examples of correspondences between various elements recited in the claims below and those described above with respect to various preferred embodiments of the present invention are explained.

In the foregoing embodiment, the base insulating layer 1 is an example of an insulating layer, the conductor trace 2 is an example of a conductor trace, and the element 100 is an example of an element.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. A printed circuit board comprising:
    an insulating layer formed of a porous film; and
    a conductor trace formed on said insulating layer, wherein said porous film has a reflectivity of not less than 50% for light of at least a part of wavelengths in a wavelength region of not less than 400 nm and not more than 800 nm.

2. The printed circuit board according to claim 1, wherein said porous film has an average pore size of not less than 0.001 μm and not more than 10 μm.

3. The printed circuit board according to claim 1, further comprising an element that receives or emits light, wherein
    said element is mounted on said insulating layer to be electrically connected to said conductor trace.

4. The printed circuit board according to claim 1, wherein said porous film has a reflectivity of not less than 50% for a wavelength of light of at least any of red, green and blue.

5. The printed circuit board according to claim 1, wherein said porous film has reflectivities of not less than 50% for wavelengths of light of red, green and blue.

6. The printed circuit board according to claim 1, wherein said porous film has reflectivities of not less than 80% for wavelengths of light of red, green and blue.

7. A method of manufacturing a printed circuit board comprising the steps of:
- preparing an insulating layer formed of a porous film having a reflectivity of not less than 50% for light of at least a part of wavelengths in a wavelength region of not less than 400 nm and not more than 800 nm; and
- forming a conductor trace on said insulating layer.

8. The method of manufacturing the printed circuit board according to claim 7, further comprising the step of mounting an element that receives or emits light on said insulating layer such that the element is electrically connected to said conductor trace.

* * * * *